(12) United States Patent
Lee et al.

(10) Patent No.: US 7,816,971 B2
(45) Date of Patent: Oct. 19, 2010

(54) SWITCH CIRCUIT HAVING ADJUSTABLE LINEARITY OF DIFFERENTIAL MODE RESISTANCES

(75) Inventors: Chao-Cheng Lee, Hsinchu (TW); Ren-Chieh Liu, Shetou Township, Changhua County (TW)

(73) Assignee: Realtek Semiconductor Corp., Hsinchu (TW)

( * ) Notice: Subject to any disclaimer, the term of this patent is extended or adjusted under 35 U.S.C. 154(b) by 9 days.

(21) Appl. No.: 12/245,401

(22) Filed: Oct. 3, 2008

(65) Prior Publication Data
US 2009/0066393 A1 Mar. 12, 2009

(30) Foreign Application Priority Data
Oct. 8, 2007 (TW) .............................. 96137688 A

(51) Int. Cl.
*H03K 17/16* (2006.01)
(52) U.S. Cl. ...................... 327/389; 327/391; 327/434

(58) Field of Classification Search .................. 327/389, 327/391, 434; 330/258
See application file for complete search history.

(56) References Cited

U.S. PATENT DOCUMENTS

| 4,573,020 A * | 2/1986 | Whatley ..................... 330/258 |
| 5,729,230 A * | 3/1998 | Jensen et al. ................ 341/143 |
| 6,697,001 B1 * | 2/2004 | Oliaei et al. ................ 341/143 |

* cited by examiner

*Primary Examiner*—Kenneth B. Wells
(74) *Attorney, Agent, or Firm*—Thomas, Kayden, Horstemeyer & Risley, LLP

(57) ABSTRACT

A switch circuit includes a pair of metal oxide semiconductor (MOS) switches and an adjusting unit. Each of the MOS switches has an input terminal and an output terminal. The MOS switches receive a pair of differential input voltages at the input terminals thereof, and output a pair of differential output voltages at the output terminals thereof when the MOS switches conduct. The adjusting unit changes a difference between common mode levels of the input terminals and the output terminals of the MOS switches so as to adjust linearity of differential mode resistances of the MOS switches.

8 Claims, 7 Drawing Sheets

SWITCH CIRCUIT HAVING ADJUSTABLE LINEARITY OF DIFFERENTIAL MODE RESISTANCES

CROSS-REFERENCE TO RELATED APPLICATION

This application claims priority of Taiwanese application no. 096137688, filed on Oct. 8, 2007.

BACKGROUND OF THE INVENTION

1. Field of the Invention

The invention relates to a switch circuit, more particularly to a linearity-adjustable switch circuit.

2. Description of the Related Art

A conventional switch circuit for relaying differential voltages includes a pair of metal oxide semiconductor (MOS) switches, each of which has an input terminal and an output terminal. Each of the MOS switches can be a NMOS switch, a PMOS switch or a CMOS switch. The MOS switches receive a pair of differential input voltages ($V_{in+}$, $V_{in-}$) at the input terminals thereof, and output a pair of differential output voltages ($V_{out+}$, $V_{out-}$) at the output terminals thereof when the MOS switches conduct.

FIGS. 1 and 2 illustrate relevant simulation results of a conventional switch circuit. The horizontal axis represents a difference ($V_{diff}$) between the differential input voltages ($V_{in+}$, $V_{in-}$), and the vertical axis represents a ratio of differential mode resistances ($R_{diff}$) of the MOS switches (based on $R_{diff}$ acquired when $V_{diff}=0$). Curve 21 is obtained when the MOS switches are NMOS switches or PMOS switches. Curve 22 is obtained when the MOS switches are CMOS switches. The definitions of $V_{diff}$ and $R_{diff}$ are as follows:

$$V_{diff}=V_{in+}-V_{in-},$$

$$R_{diff}=(V_{in+}-V_{in-})/(I_{in+}-I_{in-}),$$

where ($I_{in+}$, $I_{in-}$) are a pair of differential input currents received at the input terminals of the MOS switches.

As shown in FIGS. 1 and 2, differential mode resistances ($R_{diff}$) of the MOS switches change according to the difference ($V_{diff}$) between the differential input voltages ($V_{in+}$, $V_{in-}$). As such, when the switch circuit is applied to a linear circuit (such as a filter or an amplifier), linearity of the linear circuit will be restricted.

SUMMARY OF THE INVENTION

Therefore, the object of the present invention is to provide a linearity-adjustable switch circuit.

Accordingly, a switch circuit of the present invention comprises a pair of metal oxide semiconductor (MOS) switches and an adjusting unit. Each of the MOS switches has an input terminal and an output terminal. The MOS switches receive a pair of differential input voltages at the input terminals thereof, and output a pair of differential output voltages at the output terminals thereof when the MOS switches conduct. The adjusting unit is for changing a difference between common mode levels of the input terminals and the output terminals of the MOS switches so as to adjust linearity of differential mode resistances of the MOS switches.

BRIEF DESCRIPTION OF THE DRAWINGS

Other features and advantages of the present invention will become apparent in the following detailed description of the embodiments with reference to the accompanying drawings, of which.

DETAILED DESCRIPTION OF THE EMBODIMENTS

Figure 1:
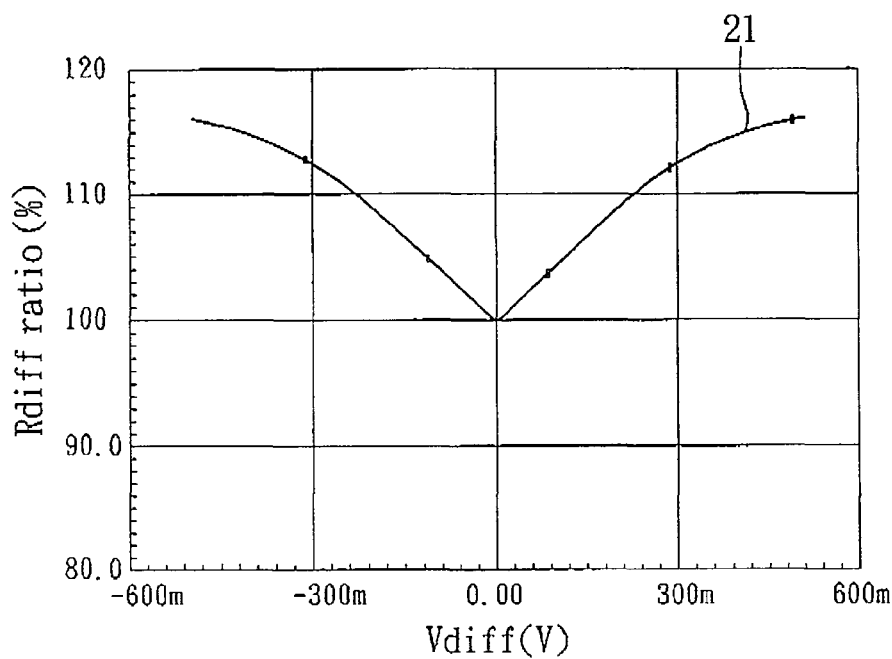
FIG. 1 is a simulation plot for illustrating ratio of differential mode resistances of a conventional switch circuit using NMOS switches or PMOS switches.
Figure 2:
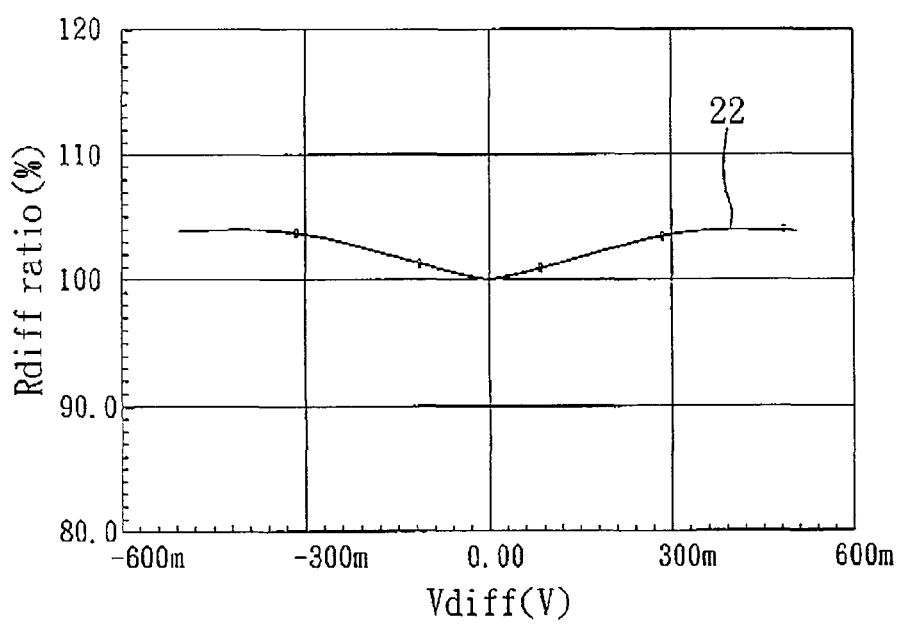
FIG. 2 is a simulation plot for illustrating ratio of differential mode resistances of a conventional switch circuit using CMOS switches.

Before the present invention is described in greater detail with reference to the accompanying embodiments, it should be noted herein that like elements are denoted by the same reference numerals throughout the disclosure.

Figure 3:
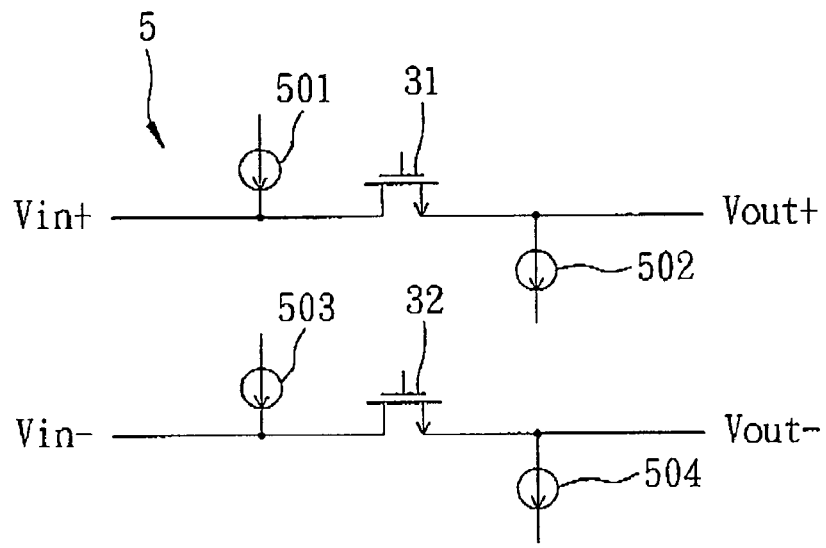
FIG. 3 is a schematic circuit diagram of the first embodiment of a switch circuit according to the present invention.

Referring to FIG. 3, the first embodiment of a switch circuit according to the present invention is shown to include a pair of metal oxide semiconductor (MOS) switches 31, 32 and an adjusting unit 5. Each of the MOS switches 31, 32 has an input terminal and an output terminal. In this embodiment, the MOS switches 31, 32 are NMOS switches. However, in practice, the MOS switches 31, 32 may as well be PMOS switches or CMOS switches. The MOS switches 31, 32 receive a pair of differential input voltages ($V_{in+}$, $V_{in-}$) at the input terminals thereof, and output a pair of differential output voltages ($V_{out+}$, $V_{out-}$) at the output terminals thereof when the MOS switches 31, 32 conduct. The adjusting unit 5 is for changing a difference ($V_{dcm}$) between common mode levels ($V_{cm,in}$, $V_{cm,out}$) of the input terminals and the output terminals of the MOS switches 31, 32 so as to adjust linearity of differential mode resistances ($R_{diff}$) of the MOS switches 31, 32. The definitions of $V_{cm,in}$, $V_{cm,out}$, $V_{dcm}$ and $R_{diff}$ are as follows:

$$V_{cm,in}=(V_{in+}+V_{in-})/2,$$

$$V_{cm,out}=(V_{out+}+V_{out-})/2,$$

$$V_{dcm}=V_{cm,in}-V_{cm,out},$$

$$R_{diff}=(V_{in+}-V_{in-})/(I_{in+}-I_{in-}),$$

where ($I_{in+}$, $I_{in-}$) are a pair of differential input currents received at the input terminals of the MOS switches 31, 32.

In this embodiment, the adjusting unit 5 includes four current sources 501-504 connected to the input terminals and the output terminals of the MOS switches 31, 32, respectively. The input terminal and the output terminal of each of the MOS switches 31, 32 receive from the respective ones of the current sources 501-504 electric currents having substantially the same magnitude but with opposite directions relative to each other. For example, if the current source 501 inputs an electric current into the input terminal of the MOS switch 31, the current source 502 draws from the output terminal of the MOS switch 31 an electric current having substantially the same magnitude as that from the current source 501, and vice versa. Through the electric currents generated by the current sources 501-504 and flowing through the MOS switches 31, 32, as well as the conduction resistances of the MOS switches 31, 32, the difference ($V_{dcm}$) between the common mode levels ($V_{cm,in}$, $V_{cm,out}$) of the input terminals and the output terminals of the MOS switches 31, 32 can be changed accordingly.

Figure 4:
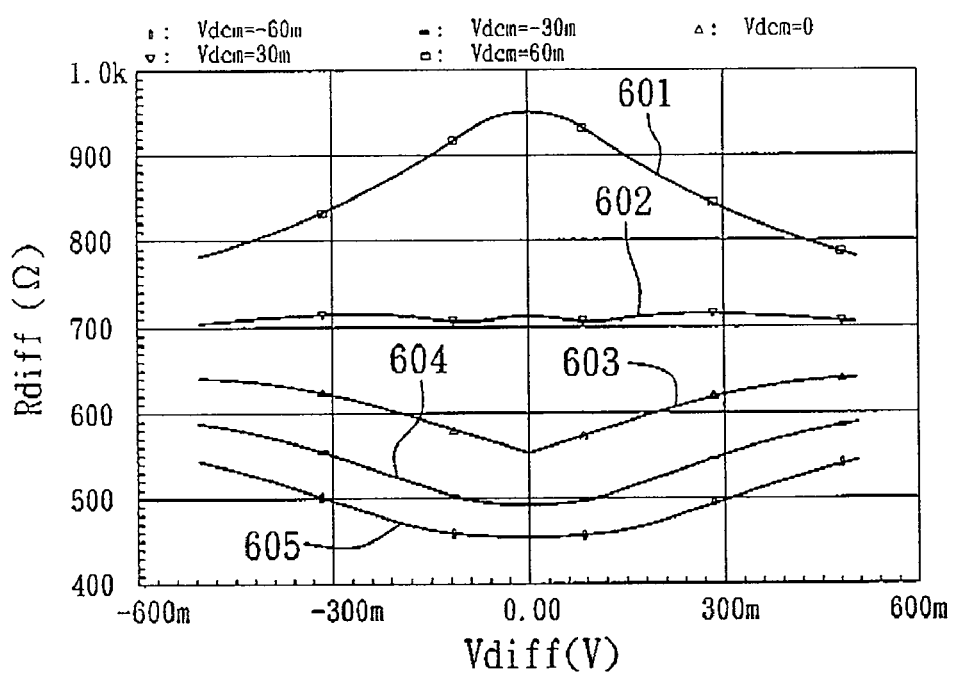
FIG. 4 is a simulation plot for illustrating differential mode resistances of the first embodiment.

FIGS. 4 to 8 illustrate relevant simulation results of the first embodiment. Referring to FIG. 4, the horizontal axis represents a difference ($V_{diff}$) between the differential input voltages ($V_{in+}$, $V_{in-}$), and the vertical axis represents differential mode resistances ($R_{diff}$) of the MOS switches 31, 32. Curves 601-605 are obtained when $V_{dcm}$=60 mV, 30 mV, 0V, −30 mV and −60 mV, respectively, wherein ($V_{dcm}$) is a difference between common mode levels ($V_{cm,in}$, $V_{cm,out}$) of the input terminals and the output terminals of the MOS switches 31, 32. The definition of ($V_{diff}$) is as follows:

$$V_{diff} = V_{in+} - V_{in-}.$$

Figure 5:
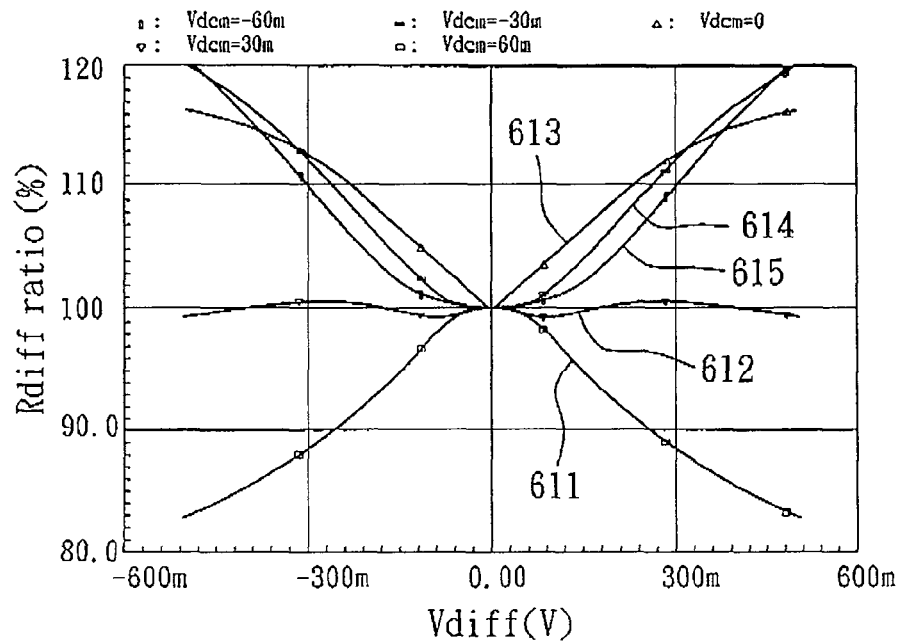
FIG. 5 is a simulation plot for illustrating ratios of differential mode resistances of the first embodiment.

Referring to FIG. 5, the horizontal axis represents a difference ($V_{diff}$) between the differential input voltages ($V_{in+}$, $V_{in-}$), and the vertical axis represents ratios of the differential mode resistances ($R_{diff}$) of the MOS switches 31, 32 (based on $R_{diff}$ acquired when $V_{diff}$=0). Curves 611-615 are obtained when $V_{dcm}$=60 mV, 30 mV, 0V, −30 mV and −60 mV, respectively, wherein ($V_{dcm}$) is a difference between common mode levels ($V_{cm,in}$, $V_{cm,out}$) of the input terminals and the output terminals of the MOS switches 31, 32.

It can be observed from FIGS. 4 and 5 that, when the difference ($V_{dcm}$) between the common mode levels ($V_{cm,in}$, $V_{cm,out}$) of the input terminals and the output terminals of the MOS switches 31, 32 is close to 30 mV, variations in the differential mode resistances ($R_{diff}$) of the MOS switches 31, 32 are minimal. Moreover, when ($V_{dcm}$) becomes smaller, ($R_{diff}$) becomes smaller as well, and a region around where the difference ($V_{diff}$) between the differential input voltages ($V_{in+}$, $V_{in-}$)=0 and whereat variations in ($R_{diff}$) are minimal becomes larger.

Subsequently, a range of the difference ($V_{diff}$) between the differential input voltages ($V_{in-}$, $V_{in-}$) is reduced, and a range of the difference ($V_{dcm}$) between the common mode levels ($V_{cm,in}$, $V_{cm,out}$) of the input terminals and the output terminals of the MOS switches 31, 32 is increased.

Figure 6:
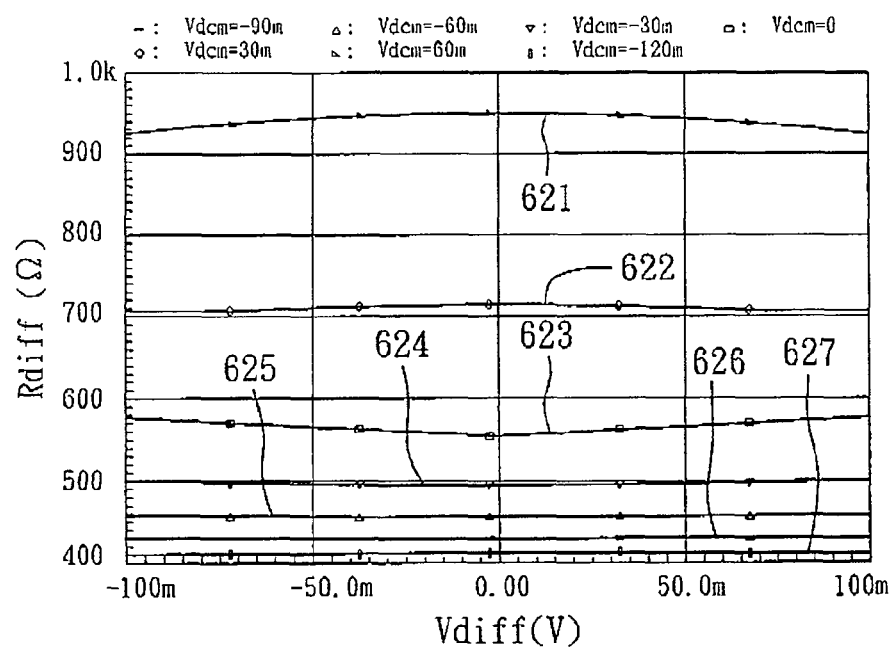
FIG. 6 is a simulation plot similar to FIG. 4 but with different ranges for some parameters.

Referring to FIG. 6, the horizontal axis represents a difference ($V_{diff}$) between the differential input voltages ($V_{in+}$, $V_{in-}$), and the vertical axis represents differential mode resistances ($R_{diff}$) of the MOS switches 31, 32. Curves 621-627 are obtained when $V_{dcm}$=60 mV, 30 mV, 0V, −30 mV, −60 mV, −90 mV and −120 mV, respectively, wherein ($V_{dcm}$) is a difference between common mode levels ($V_{cm,in}$, $V_{cm,out}$) of the input terminals and the output terminals of the MOS switches 31, 32.

Figure 7:
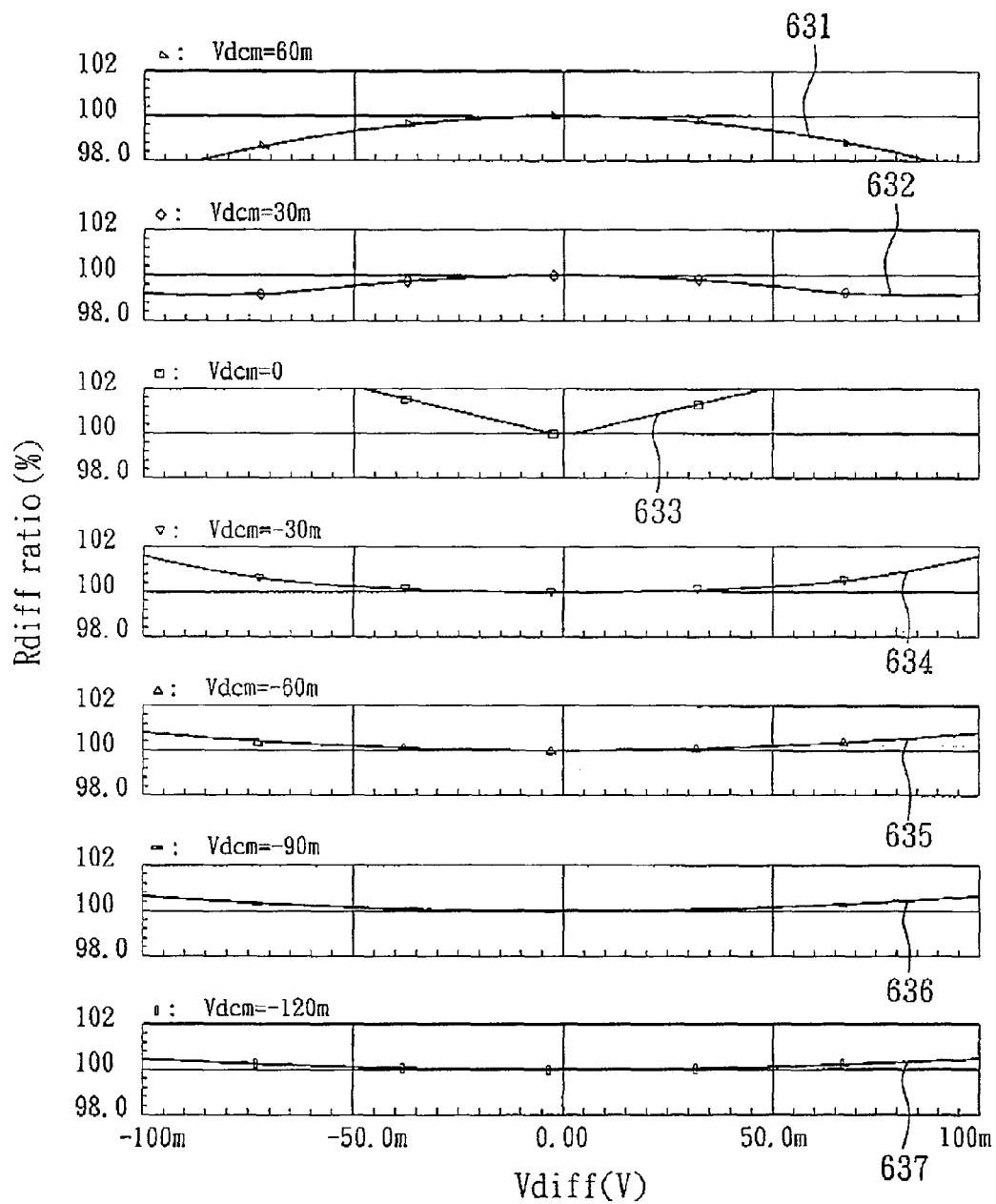
FIG. 7 is a simulation plot similar to FIG. 5 but with different ranges for some parameters.

Referring to FIG. 7, the horizontal axis represents a difference ($V_{diff}$) between the differential input voltages ($V_{in+}$, $V_{in-}$), and the vertical axis represents ratios of the differential mode resistances ($R_{diff}$) of the MOS switches 31, 32 (based on $R_{diff}$ acquired when $V_{diff}$=0). Curves 631-637 are obtained when $V_{dcm}$=60 mV, 30 mV, 0V, −30 mV, −60 mV, −90 mV and −120 mV, respectively, wherein ($V_{dcm}$) is a difference between common mode levels ($V_{cm,in}$, $V_{cm,out}$) of the input terminals and the output terminals of the MOS switches 31, 32.

Figure 8:
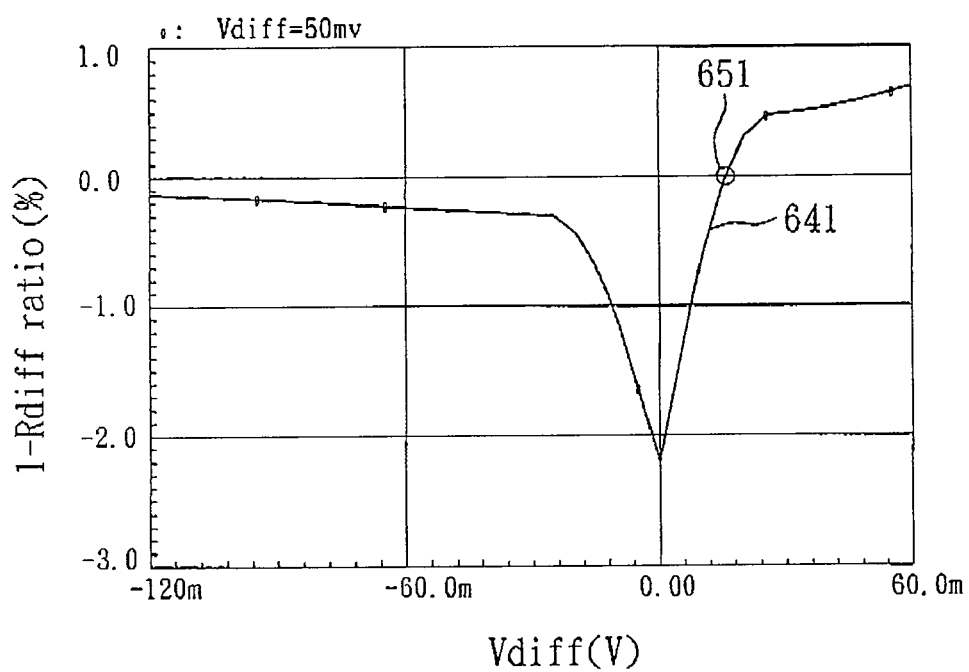
FIG. 8 is a simulation plot for illustrating differences between the ratios of differential mode resistances in FIGS. 7 and 1.

Referring to FIG. 8, the horizontal axis represents the difference ($V_{dcm}$) between the common mode levels ($V_{cm,in}$, $V_{cm,out}$) of the input terminals and the output terminals of the MOS switches 31, 32, and the vertical axis represents the differences between the ratios of differential mode resistances ($R_{diff}$) of the MOS switches 31, 32 in FIGS. 7 and 1. Curve 641 is obtained when $V_{diff}$=50 mV, wherein ($V_{diff}$) is a difference between the differential input voltages ($V_{in+}$, $V_{in-}$).

It can be observed from FIGS. 6 to 8 that, although there is one solution (as shown in point 651) for a difference ($V_{dcm}$) between the common mode levels ($V_{cm,in}$, $V_{cm,out}$) of the input terminals and the output terminals of the MOS switches 31, 32 such that variation of the differential mode resistances ($R_{diff}$) of the MOS switches 31, 32 is at the minimum, if ($V_{dcm}$) becomes smaller, another solution is obtained because ($R_{diff}$) becomes smaller, and the variation of ($R_{diff}$) also becomes smaller.

Figure 9:
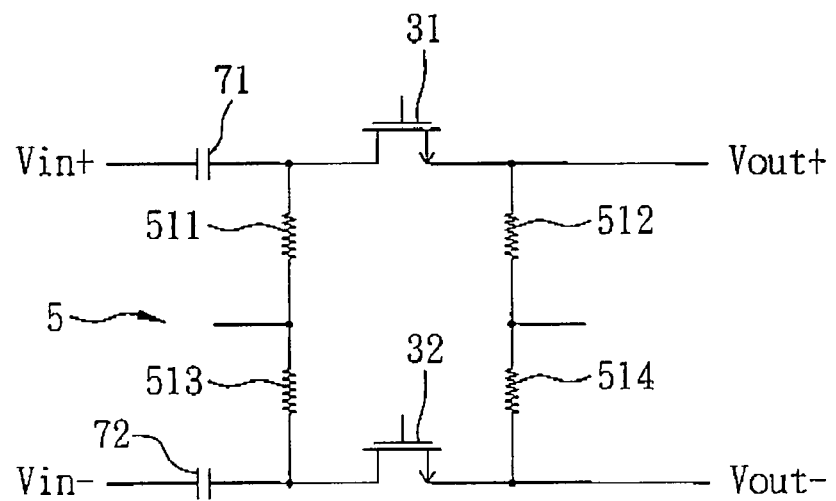
FIG. 9 is a schematic circuit diagram of the second embodiment of a switch circuit according to the present invention.

Referring to FIG. 9, the second embodiment of a switch circuit according to the present invention is shown to include a pair of MOS switches 31, 32, an adjusting unit 5, and a pair of capacitors 71, 72. The MOS switches 31, 32 receive a pair of differential input voltages ($V_{in+}$, $V_{in-}$) at the input terminals thereof through the capacitors 71, 72, respectively, and output a pair of differential output voltages ($V_{out-}$, $V_{out-}$) at the output terminals thereof when the MOS switches 31, 32 conduct.

The adjusting unit 5 includes four resistors 511-514. The MOS switches 31, 32 receive a first common mode voltage at the input terminals thereof through two of the resistors 511, 513, and receive a second common mode voltage at the output terminals thereof through the other two of the resistors 512, 514. The first and second common mode voltages respectively set the common mode levels ($V_{cm,in}$, $V_{cm,out}$) of the input terminals and the output terminals of the MOS switches 31, 32.

Figure 10:
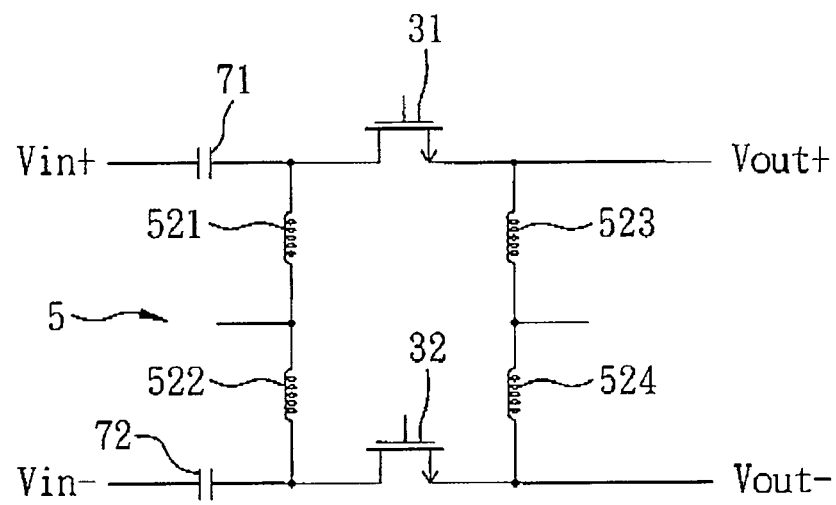
FIG. 10 is a schematic circuit diagram of the third embodiment of a switch circuit according to the present invention.

Referring to FIG. 10, the third embodiment of a switch circuit according to the present invention is shown to be similar to the second embodiment, and differs therefrom in that, in this embodiment, four inductors 521-524 are used in lieu of the four resistors 511-514.

Since the relevant simulation results of the second and third embodiments are similar to those of the first embodiment, they will not be discussed herein for the sake of brevity.

Figure 11A:
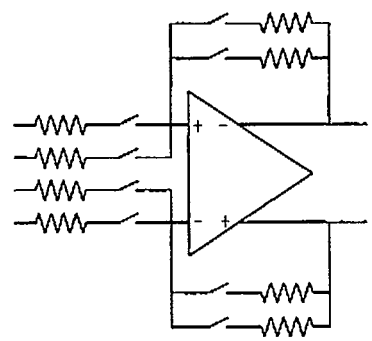
FIGS. 11a to 11d are schematic circuit diagrams to illustrate possible applications of the switch circuit of this invention.
Figure 11B:
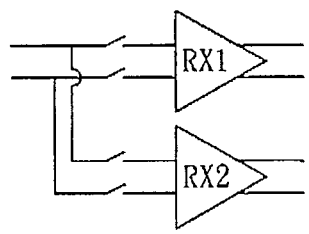
Figure 11C:
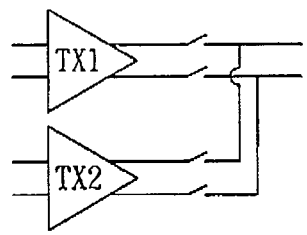
Figure 11D:
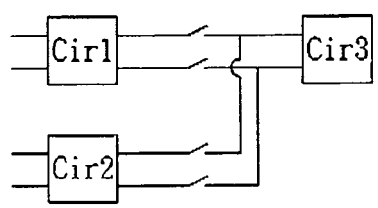

The switch circuit of the present invention is suitable for application to a variable gain amplifier (see FIG. 11a), for selecting which one of two receivers is to receive a signal (see FIG. 11b), for selecting which one of two transmitters is to transmit a signal (see FIG. 11c), and for selecting which one of two circuits is to output a signal to a next stage circuit (see FIG. 11d). However, the application of the present invention should not be limited to the above examples.

In sum, through changing the difference ($V_{dcm}$) between common mode levels ($V_{cm,in}$, $V_{cm,out}$) of the input terminals and the output terminals of the MOS switches 31, 32, linearity of differential mode resistances ($R_{diff}$) of the MOS switches 31, 32 can be adjusted accordingly, thereby achieving the object of the present invention.

While the present invention has been described in connection with what are considered the most practical embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A switch circuit comprising:
a pair of metal oxide semiconductor (MOS) switches, each of which has an input terminal and an output terminal, said MOS switches receiving a pair of differential input voltages at said input terminals thereof, and outputting a pair of differential output voltages at said output terminals thereof when said MOS switches conduct;
an adjusting unit for changing a difference between common mode levels of said input terminals and said output terminals of said MOS switches so as to adjust linearity of differential mode resistances of said MOS switches;
wherein said adjusting unit includes four current sources connected to said input terminals and said output terminals of said MOS switches, respectively; and
wherein said input terminal and said output terminal of each of said MOS switches receive from the respective ones of said current sources electric currents having substantially the same magnitude but with opposite directions relative to each other.

2. The switch circuit as claimed in claim 1, wherein each of said MOS switches is an NMOS switch.

3. The switch circuit as claimed in claim 1, wherein each of said MOS switches is a PMOS switch.

4. A switch circuit comprising:
a pair of metal oxide semiconductor (MOS) switches, each of which has an input terminal and an output terminal, said MOS switches receiving a pair of differential input voltages at said input terminals thereof, and outputting a pair of differential output voltages at said output terminals thereof when said MOS switches conduct; and
an adjusting unit for changing a difference between common mode levels of said input terminals and said output terminals of said MOS switches so as to adjust linearity of differential mode resistances of said MOS switches;
a pair of capacitors, said MOS switches receiving the pair of differential input voltages at said input terminals thereof through said capacitors, respectively, said adjusting unit including four resistors, said MOS switches receiving a first common mode voltage at said input terminals thereof through two of said resistors, and receiving a second common mode voltage at said output terminals thereof through the other two of said resistors, the first and second common mode voltages respectively setting the common mode levels of said input terminals and said output terminals of said MOS switches.

5. A switch circuit comprising:
a pair of metal oxide semiconductor (MOS) switches, each of which has an input terminal and an output terminal, said MOS switches receiving a pair of differential input voltages at said input terminals thereof, and outputting a pair of differential output voltages at said output terminals thereof when said MOS switches conduct; and
an adjusting unit for changing a difference between common mode levels of said input terminals and said output terminals of said MOS switches so as to adjust linearity of differential mode resistances of said MOS switches;
a pair of capacitors, said MOS switches receiving the pair of differential input voltages at said input terminals thereof through said capacitors, respectively, said adjusting unit including four inductors, said MOS switches receiving a first common mode voltage at said input terminals thereof through two of said inductors, and receiving a second common mode voltage at said output terminals thereof through the other two of said inductors, the first and second common mode voltages respectively setting the common mode levels of said input terminals and said output terminals of said MOS switches.

6. A method for adjusting the linearity of a switch circuit comprising a pair of metal oxide semiconductor (MOS) switches, each of which has an input terminal and an output terminal, the method comprising:
receiving a differential input voltage at the input terminals;
adjusting a linearity of differential mode resistances of the MOS switches by changing a difference between common mode levels of the input terminals and the output terminals of the MOS switches
outputting a pair of differential output voltages at the output terminals;
wherein the step of adjusting the linearity of differential mode resistances of the MOS switches more specifically comprises:
connecting four current sources to the input terminals and the output terminals of the MOS switches; and
controlling the four current sources such that the input terminal and the output terminal of each of the MOS switches receives from the respective ones of said current sources electric currents having substantially the same magnitude but with opposite directions relative to each other.

7. A method for adjusting the linearity of a switch circuit comprising a pair of metal oxide semiconductor (MOS) switches, each of which has an input terminal and an output terminal, the method comprising:
receiving a differential input voltage at the input terminals;
adjusting a linearity of differential mode resistances of the MOS switches by changing a difference between common mode levels of the input terminals and the output terminals of the MOS switches
outputting a pair of differential output voltages at the output terminals;
wherein the step of adjusting the linearity of differential mode resistances of the MOS switches more specifically comprises:
connecting a pair of capacitors to the MOS switches such that the MOS switches receive the pair of differential input voltages at said input terminals thereof through said capacitors, respectively;
connecting four resistors to the MOS switches such that the MOS switches receive a first common mode voltage at said input terminals thereof through two of said resistors, and such that the MOS switches receive a second common mode voltage at said output terminals thereof through the other two of said resistors; and
respectively setting the first and second common mode voltage levels of said input terminals and said output terminals of said MOS switches.

8. A method for adjusting the linearity of a switch circuit comprising a pair of metal oxide semiconductor (MOS) switches, each of which has an input terminal and an output terminal, the method comprising:
receiving a differential input voltage at the input terminals;
adjusting a linearity of differential mode resistances of the MOS switches by changing a difference between common mode levels of the input terminals and the output terminals of the MOS switches
outputting a pair of differential output voltages at the output terminals;
wherein the step of adjusting the linearity of differential mode resistances of the MOS switches more specifically comprises:
connecting a pair of capacitors to the MOS switches such that the MOS switches receive the pair of differential input voltages at said input terminals thereof through said capacitors, respectively;

connecting four inductors to the MOS switches such that the MOS switches receive a first common mode voltage at said input terminals thereof through two of said inductors, and such that the MOS switches receive a second common mode voltage at said output terminals thereof through the other two of said inductors; and respectively setting the first and second common mode voltage levels of said input terminals and said output terminals of said MOS switches.

* * * * *